United States Patent [19]
Kadota et al.

[11] Patent Number: 6,150,900
[45] Date of Patent: Nov. 21, 2000

[54] SURFACE ACOUSTIC WAVE FILTER DUPLEXER AND COMMUNICATIONS APPARATUS UTILIZING EDGE REFLECTION OF SH-TYPE WAVES

[75] Inventors: Michio Kadota; Hideya Horiuchi, both of Kyoto; Mamoru Ikeura, Nagaokakyo, all of Japan

[73] Assignee: Murata Manufacturing Co, Ltd, Japan

[21] Appl. No.: 09/309,859

[22] Filed: May 11, 1999

[30] Foreign Application Priority Data

May 14, 1998 [JP] Japan ................... 10-131514

[51] Int. Cl.[7] .................. H03H 9/64; H03H 9/72
[52] U.S. Cl. .................. 333/133; 333/193; 310/313 B
[58] Field of Search ................... 333/193–196, 333/133; 310/313 R, 313 B, 313 C, 313 D

[56] References Cited

U.S. PATENT DOCUMENTS

| 5,714,830 | 2/1998 | Kadota et al. | 310/313 B X |
| 5,767,603 | 6/1998 | Kadota et al. | 310/313 B |
| 5,814,917 | 9/1998 | Isobe et al. | 310/313 B |
| 5,952,899 | 9/1999 | Kadota et al. | 333/193 |

FOREIGN PATENT DOCUMENTS

| 0 541 284 A1 | 5/1993 | European Pat. Off. . |
| 0 652 637 A1 | 5/1995 | European Pat. Off. . |
| 0 740 411 A1 | 10/1996 | European Pat. Off. . |
| 0 746 095 A1 | 12/1996 | European Pat. Off. . |
| 0 758 819 A1 | 2/1997 | European Pat. Off. . |
| 0 788 224 A1 | 8/1997 | European Pat. Off. . |
| 0 853 381 A2 | 7/1998 | European Pat. Off. . |
| 0 897 218 A2 | 2/1999 | European Pat. Off. . |
| 53-123051 | 10/1978 | Japan . |
| 5-291869 | 11/1993 | Japan | 310/313 B |
| 8-204501 | 8/1996 | Japan | 333/193 |

OTHER PUBLICATIONS

Search Report and Written Opinion by Austrian Patent Office Application No. 9901993–7 Filing date Apr. 30, 1999.

Primary Examiner—Robert Pascal
Assistant Examiner—Barbara Summons
Attorney, Agent, or Firm—Keating & Bennett LLP

[57] ABSTRACT

A surface acoustic wave filter includes edge-reflection type surface acoustic wave resonators arranged as series and parallel arm resonators and connected in a ladder configuration. The edge-reflection type surface acoustic wave resonators defining the series and parallel arm resonators are disposed on a single common substrate and arranged so as to be substantially parallel to the end surface of the edge-reflection type surface acoustic wave resonators.

21 Claims, 10 Drawing Sheets

SURFACE ACOUSTIC WAVE FILTER DUPLEXER AND COMMUNICATIONS APPARATUS UTILIZING EDGE REFLECTION OF SH-TYPE WAVES

BACKGROUND OF THE INVENTION

1. Field of the Invention

The present invention relates to a surface acoustic wave filter including a plurality of edge-reflection type surface acoustic wave resonators connected in a ladder arrangement and more particularly, the present invention relates to a surface acoustic wave filter, duplexer, and communications apparatus having a small size and using significantly fewer internal bonding wires than conventional devices.

2. Description of the Related Art

A surface acoustic wave filter including a plurality of surface acoustic wave resonators connected in a ladder arrangement has been proposed as a band-pass filter to be used in a mobile communications apparatus such as a cellular phone or other such apparatus.

For example, Japanese Unexamined Patent Publication No. 53-123051 discloses a surface acoustic wave filter including a plurality of edge-reflection type surface acoustic wave resonators which make use of a SH type surface wave such as a shear wave, as an example of the above-mentioned surface acoustic wave filter.

FIG. 18 schematically shows one example of such a conventional surface acoustic wave filter. A surface acoustic wave filter 101 includes a plurality of edge-reflection type resonators 102, 103 connected in a ladder arrangement and which makes use of a piezoelectric surface shear wave as a SH type surface wave. As shown in FIG. 18, between input-output ports 104, 105, three edge-reflection type surface-wave resonators 102 are arranged as a series arm and three edge-reflection type surface-wave resonators 103 are arranged as parallel arms.

The edge-reflection type resonators 102 and 103 include piezoelectric substrates 102x and 103x on which IDTs 102y and 103y are disposed, respectively, and each of the edge-reflection type resonators 102 and 103 is connected via bonding wires so as to define a ladder circuit.

The conventional surface acoustic wave filter has the following drawbacks. Specifically, since each IDT 102y and each IDT 103 are disposed on separate piezoelectric substrates 102x and 103x, respectively, it is necessary to electrically connect together the IDTs 102y or connect together the IDTs 103y or interconnect the IDTs 102y and 103y via bonding wires in order to form a ladder circuit. This requires a complicated bonding and connection process.

Further, in edge-reflection type surface acoustic wave resonators, the edge surface for reflecting a SH wave is required to be formed with very high precision in order to function properly. Since the edge surfaces are formed when the piezoelectric substrates 102x, 103x are cut by dicing, the process of dicing is required for each of the piezoelectric substrates. Accordingly, the number of dicing processes is very large and the manufacturing process is also complicated.

SUMMARY OF THE INVENTION

To overcome the problems described above, preferred embodiments of the present invention provide a small-sized and inexpensive surface acoustic wave filter which is manufactured using greatly simplified wire bonding and dicing processes.

A surface acoustic wave filter includes edge-reflection type surface acoustic wave resonators arranged as series and parallel arm resonators and connected in a ladder configuration, and the edge-reflection type surface acoustic wave resonators defining the series and parallel arm resonators are disposed on a single common substrate and are arranged so as to be substantially parallel to the end surfaces of the edge-reflection type surface acoustic wave resonators. According to this structure, the dicing processes required for the substrate end surfaces are greatly reduced.

In one preferred embodiment, the edge-reflection type surface acoustic wave resonators defining the series arm resonators and the edge-reflection type surface acoustic wave resonators defining the parallel arm resonators are alternately arranged. According to this structure, an electrode easily connects the series arm resonators and the parallel arm resonators disposed on the same substrate.

In a further preferred embodiment, the edge-reflection type surface acoustic wave resonators defining the series arm resonators are connected to one another by connecting electrodes disposed on the same substrate, and the connecting electrode is separated from the outermost electrode finger of the edge-reflection type surface acoustic wave resonators defining the parallel arm resonators by a gap which is substantially equal to a gap between the edge of the electrode fingers constituting the edge-reflection type surface acoustic wave resonators defining the parallel arm resonators and the edge of an adjacent one of the electrode fingers. According to this unique structure, the number of connections via wire bonding is significantly decreased, and the effect of the connecting electrodes on the resonance characteristic of the edge-reflection type surface-wave resonators is also greatly reduced.

In another preferred embodiment, at least either the electrode fingers constituting the edge-reflection type surface acoustic wave resonators which define the series arm resonators or the electrode fingers constituting the edge-reflection type surface acoustic wave resonators defining the parallel arm resonators include split electrodes. According to this structure, a narrow-band filter characteristic is achieved.

In another preferred embodiment, surface acoustic wave resonators arranged to act as a trap resonator function are disposed on the same substrate. According to this structure, the attenuation value in a desired bandwidth is greatly improved.

In a further preferred embodiment, reactance elements are disposed on the same substrate. According to the structure, the characteristic of edge-reflection type surface acoustic wave resonators are easily changed by the reactance elements.

In another preferred embodiment, the width of transposition section of the electrode fingers constituting the edge-reflection type surface acoustic wave resonators defining the parallel arm resonators is made larger than the width of the transposition section of the electrode fingers constituting the edge-reflection type surface acoustic wave resonators defining the series arm resonators. According to the structure, the capacitance of the edge-reflection type surface acoustic wave resonators defining the parallel arm resonators can be made larger than the capacitance of the edge-reflection type surface acoustic wave resonators defining the series arm resonators.

In another preferred embodiment, the electrode pattern of the edge-reflection type surface acoustic wave resonators defining the series or parallel arm resonators is divided into two or more patterns. According to this structure, even if the number of pairs of electrode fingers of the edge-reflection type surface acoustic wave resonators is increased, the capacitance can still be significantly reduced.

In another preferred embodiment, the number of divisions of the electrode pattern of the edge-reflection type surface acoustic wave resonators defining the parallel arm resonators is made smaller than the number of divisions of the electrode pattern of the edge-reflection type surface acoustic wave resonators defining the series arm resonators. According to this structure, the equivalent parallel capacitance of edge-reflection type surface acoustic wave resonators defining the parallel arm resonators can be made larger than the equivalent parallel capacitance of the edge-reflection type surface acoustic wave resonators defining the series arm resonators.

In a further preferred embodiment, dummy electrodes are located in the vicinity of the end surface of the edge-reflection type surface acoustic wave resonators defining the parallel arm resonators or the edge-reflection type surface acoustic wave resonators defining the series arm resonators. According to this structure, the different distances between end surfaces produced because of the different numbers of pairs between edge-reflection type surface acoustic wave resonators defining the series arm resonators and edge-reflection type surface acoustic wave resonators defining the parallel arm resonators can be eliminated. Further, in the process of dicing, because dicing takes place in the portion in which the dummy electrodes are located, deterioration of the characteristic due to disconnection, and other problems are able to be prevented.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
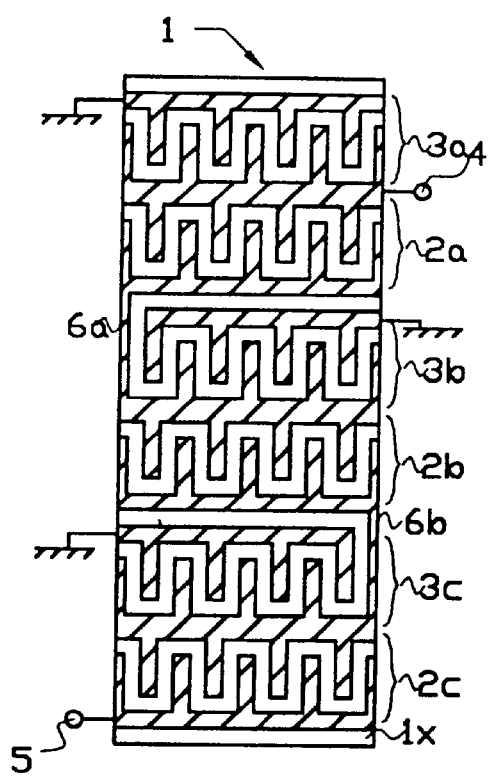
FIG. 1 is a plan view of a surface acoustic wave filter according to a first preferred embodiment of the present invention.
Figure 2:
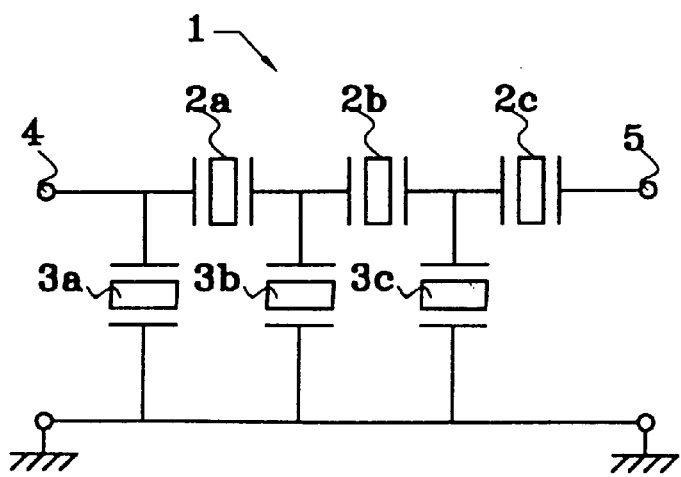
FIG. 2 is an equivalent circuit diagram of the surface acoustic wave filter shown in FIG. 1.

As shown in FIGS. 1 and 2, a surface acoustic wave filter 1 includes a plurality of edge-reflection type surface acoustic wave resonators 2a–2c and 3a–3c disposed on a single common piezoelectric substrate 1x.

As best understood from FIG. 2, the edge-reflection type surface acoustic wave resonators 2a–2c are arranged to define series arm resonators and the edge-reflection type surface acoustic wave resonators 3a–3c are arranged to define parallel arm resonators. That is, between the input-output ports 4, 5, the edge-reflection type surface acoustic wave resonators 2a–2c defining the series arm resonators are arranged to constitute a series arm and the edge-reflection type surface acoustic wave resonators 3a–3c defining the parallel arm resonators are respectively arranged between the series arm and the ground potential.

Further, as shown in FIG. 1, the edge-reflection type surface acoustic wave resonators 3a–3c defining the parallel arm resonators and the edge-reflection type surface acoustic wave resonators 2a–2c defining the series arm resonators are alternately arranged so as to be substantially parallel to a pair of end surfaces of the piezoelectric substrate 1x so that each pair of the end surfaces for reflecting surface waves, of the edge-reflection type surface acoustic wave resonators 2a–2c and 3a–3c are aligned and define the pair of the end surfaces of the piezoelectric substrate.

A connecting electrode 6a is arranged to extend along one of the end surfaces of the piezoelectric substrate 1x so as to electrically connect the edge-reflection type surface acoustic wave resonators 2a, 3b and 2b. A connecting electrode 6b is arranged to extend along the other end surface of the piezoelectric substrate 1x so as to electrically connect the edge-reflection type surface acoustic wave resonators 2b, 3c and 2c.

Furthermore, each of the electrode fingers constituting an IDT of the edge-reflection type surface acoustic wave resonators 2a–2c and 3a–3c has a electrode finger width substantially equal to $\lambda/4$, where $\lambda$ represents a wavelength of a surface acoustic wave excited in the edge-reflection type surface acoustic wave resonators 2a–2c and 3a–3c. A space between each pair of adjacent electrode fingers is also set to be substantially equal to λ/4.

In the edge-reflection type resonators 3b and 3c, the electrode fingers which are located close to the connecting electrodes 6a and 6b are set to have a width substantially equal to λ/4, and the electrode fingers aligned with the end surfaces opposite to the end surface on which the connecting electrodes 6a and 6b are located have a width substantially equal to λ/8. In the edge-reflection type resonators 2a–2c and 3a, the electrode fingers located closest to the opposing end surfaces of the piezoelectric substrate 1x have a width which is substantially equal to λ/8.

It is noted that FIG. 1 shows that the number of pairs of electrode fingers and the width of the electrode fingers of the edge-reflection type surface acoustic wave resonators 2a–2c as series arm resonators are the same as those of edge-reflection type surface acoustic wave resonators 3a–3c defining the parallel arm resonators for convenience. However, the number of pairs of electrode fingers and the width of the electrode fingers should be different between the edge-reflection type surface acoustic wave resonators 2a–2c and the edge-reflection type surface acoustic wave resonators 3a–3c as resonance frequencies are made different between the edge-reflection type surface acoustic wave resonators 2a–2c and the edge-reflection type surface acoustic wave resonators 3a–3c. More specifically, the resonance frequency of the edge-reflection type surface acoustic wave resonators 2a–2c defining the series arm resonators is preferably set to be substantially identical to an antiresonance frequency of the edge-reflection type surface acoustic wave resonators 3a–3c.

In such a manner, because the wavelength and number of pairs of electrode fingers of the edge-reflection type surface acoustic wave resonators 2a–2c are different from those of edge-reflection type surface acoustic wave resonators 3a–3c, there are many cases in which the widths of the outermost electrode fingers of the edge-reflection type surface acoustic wave resonators 2a–2c and 3a–3b are difficult to set to be about λ/8. Although it is ideal to set the widths of the outermost electrode fingers to be about λ/8, even if the widths of the outermost electrode fingers deviate from the value of λ/8, the characteristic is not deteriorated significantly, and as a result the widths are not particularly limited to the value of approximately λ/8.

Further, the connecting electrodes 6a and 6b are also preferably set to have a width substantially equal to λ/8. The spaces between the edges of connecting electrodes 6a and 6b and the edge of the electrode finger adjacent to the connecting electrodes 6a and 6b are respectively set to be substantially equal to λ/4.

As mentioned above, in the surface acoustic wave filter 1, since the edge-reflection type surface acoustic wave resonators 3a–3c and edge-reflection type surface acoustic wave resonators 2a–2c are arranged on the same, common piezoelectric substrate 1x so as to be substantially parallel to the end surface, the dicing processes for end surfaces are finished in two steps and the dicing processes of end surfaces are able to be reduced compared with the conventional structures.

Further, because the edge-reflection type surface acoustic wave resonators 3a–3c defining the parallel arm resonators and the edge-reflection type surface acoustic wave resonators 2a–2c defining the series arm resonators are alternately arranged, the connection between the edge-reflection type surface acoustic wave resonators 2a–2c as series arm resonators is easily achieved by the connecting electrodes 6.

Furthermore, because the electrode fingers which are located closest to the end surface among the electrode fingers constituting the edge-reflection type surface acoustic wave resonators 2, 3 are set to have a width nearly equal to λ/8, the ripple within the pass band of the surface acoustic wave filter 1 is significantly reduced.

In addition, since the space from the edge of a connecting electrode 6a or 6b to the edge of the electrode finger adjacent to the connecting electrode 6 is preferably set to be nearly λ/4, there is no adverse effect on the resonance characteristic of the edge-reflection type surface acoustic wave resonators defining the parallel arm resonators adjacent to the connecting electrode 6a or 6b.

Although FIGS. 1 and 2 show a surface acoustic wave filter 1 in which the edge-reflection type surface acoustic wave resonators 2a–2c and 3a–3c are arranged in the order of a parallel arm resonator—a series arm resonator—a parallel arm resonator—a series arm resonator—a parallel arm resonator—a series arm resonator.

Figure 3:
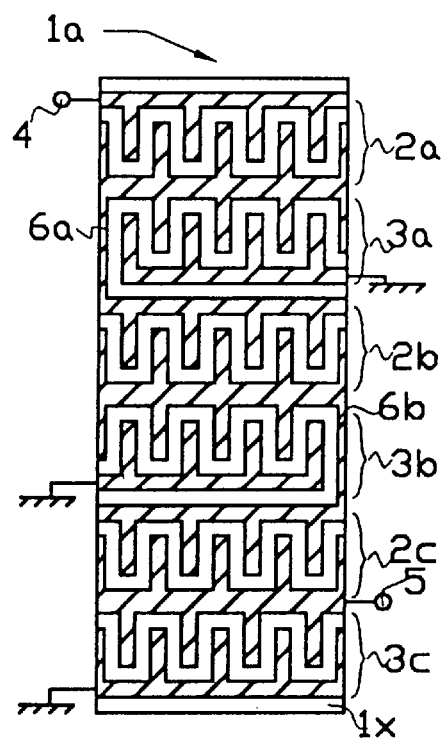
FIG. 3 is a plan view of a surface acoustic wave filter according to a first variation of the first preferred embodiment of the present invention.
Figure 4:
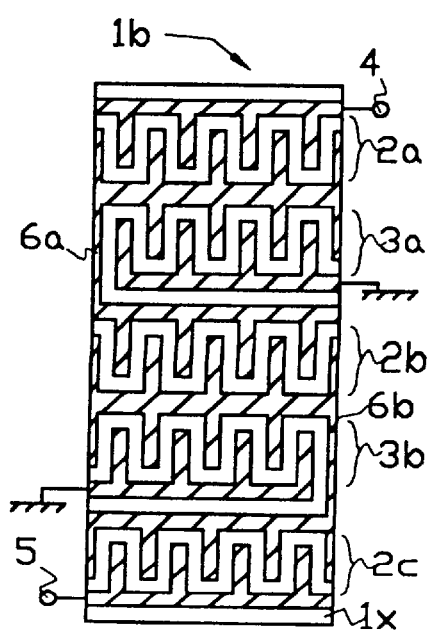
FIG. 4 is a plan view of a surface acoustic wave filter according to a second variation of the first preferred embodiment of the present invention.
Figure 5:
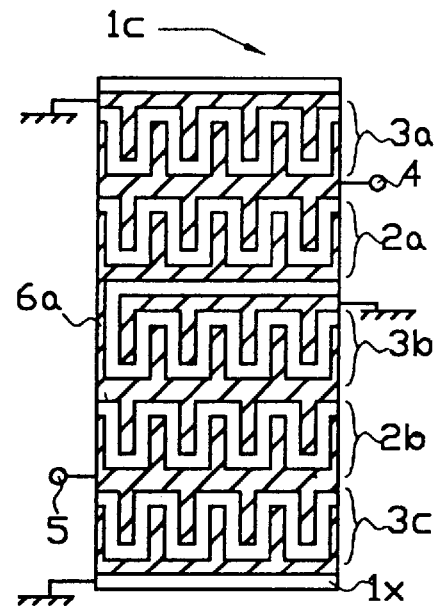
FIG. 5 is a plan view of a surface acoustic wave filter according to a third variation of the first preferred embodiment of the present invention.

However, the present preferred embodiment is not limited to this arrangement. As shown in surface acoustic wave filter 1a in FIG. 3, the edge-reflection type surface acoustic wave resonators 2a–2c and 3a–3c may be arranged in the order of a series arm resonator (2a)—a parallel arm resonator (3a)—a series arm resonator (2b)—a parallel arm resonator (3b)—a series arm resonator (2c)—a parallel arm resonator (3c). FIG. 4 shows a surface acoustic wave filter 1b in which the edge-reflection type surface acoustic wave resonators 2a–2c and 3a–3b are arranged in the order of a series arm resonator (2a)—a parallel arm resonator (3a)—a series arm resonator (2b)—a parallel arm resonator (3b)—a series arm resonator (2c). FIG. 5 shows a surface acoustic wave filter 1c in which the edge-reflection type surface acoustic wave resonators 2a–2b and 3a–3c are arranged in the order of a parallel arm resonator (3a)—a series arm resonator (2a)—a parallel arm resonator (3b)—a series arm resonator (2b)—a parallel arm resonator (3c). Alternatively, a construction in which each one of the series arm resonator and the parallel arm resonator or the series arm resonators and the parallel arm resonators are arranged in this order has the same effect as in the present preferred embodiment.

Figure 6:
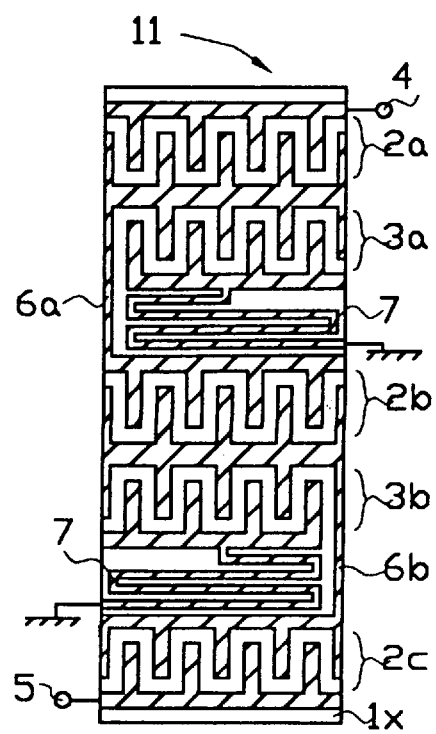
FIG. 6 is a plan view of a surface acoustic wave filter according to a second preferred embodiment of the present invention.

Next, a second preferred embodiment of the present invention is explained. FIG. 6 is a plan view of a surface acoustic wave filter showing the second preferred embodiment of the present invention. Further, the same reference numerals used in FIGS. 1–5 are used to indicate similar structure in FIG. 6 and therefore, detailed explanation of like elements is omitted.

As shown in FIG. 6, the surface acoustic wave filter 11 has the structure of a series arm resonator (2a)—a parallel arm resonator (3a)—a series arm resonator (2b)—a parallel arm resonator (3b)—a series arm resonator (2c) as in FIG. 4, and reactance elements 7 are disposed between the edge-reflection type surface acoustic wave resonators 3a and the ground potential and between the edge-reflection type surface acoustic wave resonators 3b and the ground potential.

Thus, by adding reactance elements 7 to the edge-reflection type surface acoustic wave resonators 3a and 3b, the difference between the resonance frequency and anti-resonance frequency of the edge-reflection type surface acoustic wave resonators 3a and 3b defining the parallel arm resonators is greatly increased. As a result, it is possible to significantly widen the frequency characteristic of the surface acoustic wave filter 11 and greatly improve the out-of-band attenuation value.

In the present preferred embodiment, inductors are preferably used as reactance elements, but this is not limited thereto. For example, capacitors, resistors, etc. may be used as the reactance elements. Further, the edge-reflection type surface acoustic wave resonators constructed for easily improving filter characteristics are not limited to the parallel arm resonators, and the characteristics of the edge-reflection type surface acoustic wave resonators as series arm resonators may be able to be changed, or both of them may be changed.

Figure 7:
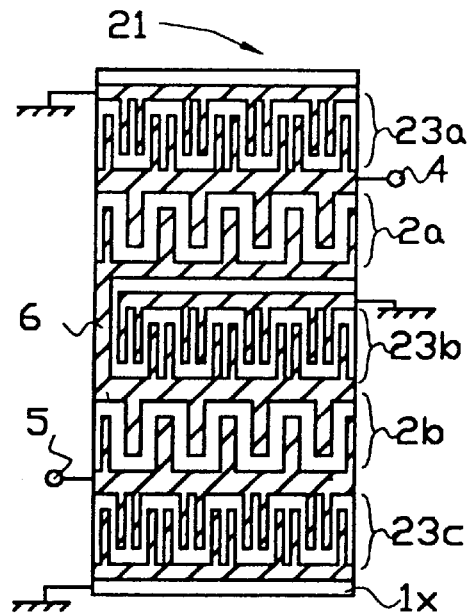
FIG. 7 is a plan view of a surface acoustic wave filter according to a third preferred embodiment of the present invention.

Next, a third preferred embodiment of the present invention is explained. FIG. 7 is a plan view of a surface acoustic wave filter showing a third preferred embodiment of the present invention. Like reference numerals used in FIGS. 1–6 are used to describe the structure of FIG. 7 and detailed explanations of similar structure is omitted.

As shown in FIG. 7, a surface acoustic wave filter 21 is substantially identical to the surface acoustic wave filter 1c shown in FIG. 5 except that the edge-reflection type surface acoustic wave resonators 3a–3c defining the parallel arm resonators are replaced with edge-reflection type surface acoustic wave resonators 23a–23c having split electrode-type IDTs.

The width of the split electrode is preferably set to be about λ/8, and the space between the electrodes is also preferably set to be about λ/8. Further, the outermost split electrode which is closest to the end surfaces of the piezoelectric substrate 1 x is preferably a single electrode.

With this construction, the bandwidth of the surface acoustic wave filter 21 is made significantly narrower compared with the frequency characteristic of the surface acoustic wave filter 1c shown in FIG. 5.

Figure 8:
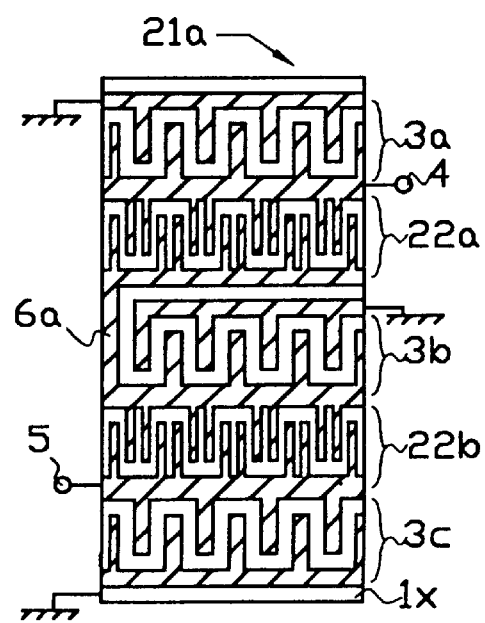
FIG. 8 is a plan view of a surface acoustic wave filter according to a first variation of the third preferred embodiment of the present invention.

The present preferred embodiment is not limited to the structure shown in FIG. 7, and, for example, as in a surface acoustic wave filter 21a shown in FIG. 8, only the edge-reflection type surface acoustic wave resonators 22a–22b defining the series arm resonators may be made split electrodes. Further, as in a surface acoustic wave filter 21b shown in FIG. 9, both of the edge-reflection type surface acoustic wave resonators 22a–22b defining the series resonators and the edge-reflection type surface acoustic wave resonators 23a–23c defining the parallel arm resonators may be made split electrodes.

Figure 9:
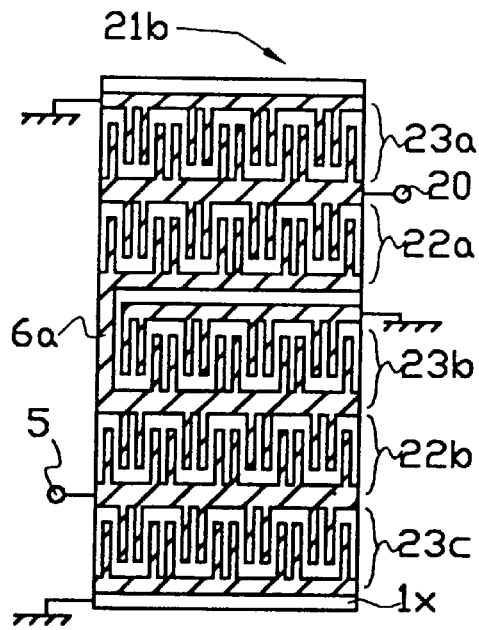
FIG. 9 is a plan view of a surface acoustic wave filter according to a second variation of the third preferred embodiment of the present invention.

Note that, in either of the surface acoustic wave filters 21a, 21b shown in FIGS. 8 and 9, the electrode width of one of the split electrodes is preferably set to be about λ/8. The space between electrodes is preferably set to be about equal to λ/8, and the gap between the edge of the outermost split electrode adjacent to the end surface and the end surface is preferably set to be about λ/16.

Figure 10:
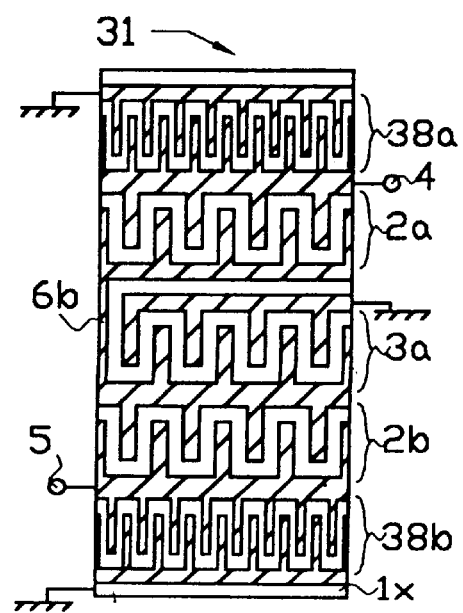
FIG. 10 is a plan view of a surface acoustic wave filter according to a fourth preferred embodiment of the present invention.

Next, a fourth preferred embodiment of the present invention is explained. FIG. 10 is a plan view of a surface acoustic wave filter showing the fourth preferred embodiment of the present invention. Further, the same reference numerals used in FIGS. 1–9 are used in FIG. 10 to indicate like elements, and detailed explanation of like elements is omitted.

As shown in FIG. 10, a surface acoustic wave filter 31 has a structure including a series arm resonator (2a)—a parallel arm resonator (3a)—a series arm resonator (2b) type, and edge-reflection type surface acoustic wave resonators 38a and 38b acting as a trap resonator are arranged to be substantially parallel between the input/output ports 4 and 5 and the ground potential, respectively. The edge-reflection type surface acoustic wave resonators 38a and 38b are designed to have desired trap characteristics in order to improve the out-of-band attenuation value of the filter 31.

In the present preferred embodiment, the surface acoustic wave resonator 38a and 38b acting as a trap resonator is preferably made of an edge-reflection type, but this is not limiting of the present preferred embodiment. It may be constructed so as to reduce the number of pairs of surface acoustic wave resonators and have reflectors located on both sides of the surface acoustic wave resonators. Furthermore, the electrode fingers of the surface acoustic wave resonator 38a and 38b acting as a trap resonator may be made of split electrodes. Furthermore, in the present preferred embodiment, the surface acoustic wave resonators 38a and 38b acting as a trap resonator have been arranged between the input-output ports and the ground, but this arrangement is limited to this. If the surface acoustic wave resonators 38a and 38b acting as a trap resonator are inserted so as to be substantially parallel to the circuit, they provide an excellent energy trap characteristics, and the number of surface acoustic wave resonators for performing a trap resonator does not cause a problem.

Figure 11:
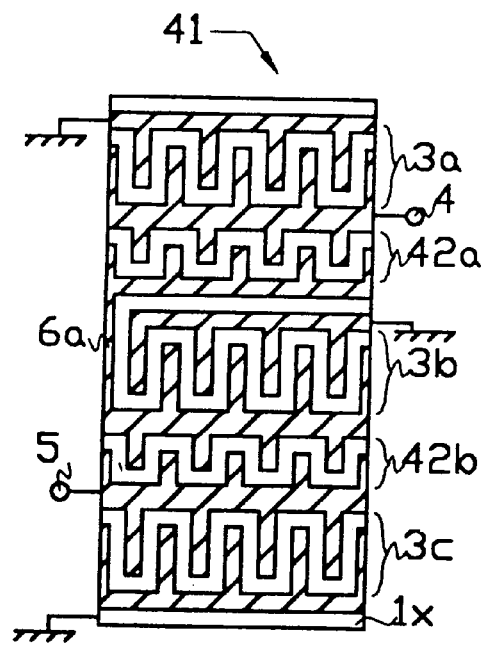
FIG. 11 is a top plan view of a surface acoustic wave filter according to a fifth preferred embodiment of the present invention.

Next, a fifth preferred embodiment of the present invention is explained. FIG. 11 is a plan view of a surface acoustic wave filter showing the fifth preferred embodiment of the present invention. Further, the same reference numerals used in FIGS. 1–10 are used in FIG. 11 to indicate like elements, and detailed explanation of like elements is omitted.

As shown in FIG. 11, a surface acoustic wave filter 41 has substantially the same structure as that of the surface acoustic wave filter 1c shown in FIG. 5 except that the edge-reflection type surface acoustic wave resonators 2a–2b shown in FIG. 5 are replaced with edge-reflection type surface acoustic wave resonators 42a–42b having a cross length (i.e. a width of a transposition section of the electrode finger) which is smaller than that of the edge-reflection type surface acoustic wave resonators 3a–3c.

In such a construction, the capacitance of the edge-reflection type surface acoustic wave resonators 3a–3c defining the parallel arm resonators can be significantly increased, and the out-of-band attenuation characteristic of the surface acoustic wave filter is greatly improved.

Figure 12:
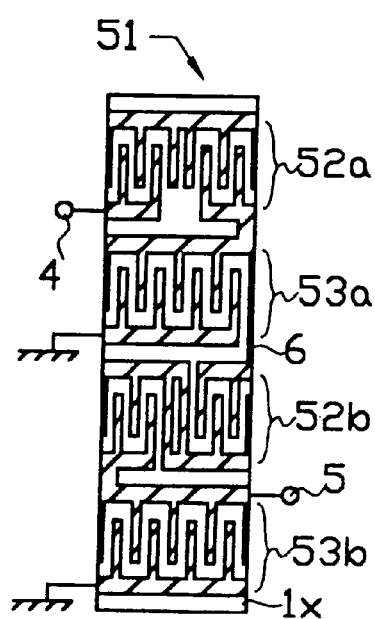
FIG. 12 is a plan view of a surface acoustic wave filter according to a sixth preferred embodiment of the present invention.

Next, a sixth preferred embodiment of the present invention is explained. FIG. 12 is a plan view of a surface acoustic wave filter showing the sixth preferred embodiment of the present invention. Further, the same reference numerals used in FIGS. 1–11 are used in FIG. 11 to indicate like elements, and detailed explanation of like elements is omitted.

As shown in FIG. 12, a surface acoustic wave filter 51 includes edge-reflection type surface acoustic wave resonators 52a and 52b connected in series between input/output ports 4 and 5 so as to define a series arm and edge-reflection type surface acoustic wave resonators 53a and 53b connected in parallel between the series arm and the ground potential. The edge-reflection type surface acoustic wave resonators 52a–52b and 53a–53b are arranged on a piezoelectric substrate 1x in the order of a series arm resonator (52a)—a parallel arm resonator (53a)—a series arm resonator (52b)—a parallel arm resonator (53b). One of the essential features of the surface acoustic wave filter 51 is that electrode patterns of the of edge-reflection type surface acoustic wave resonators 52a and 52b defining the series arm resonators are divided in half, respectively. As a result, the edge-reflection type surface acoustic wave resonators 52a and 52b are equivalent to and have the same structure as two resonators of half the number of pairs which are connected in series. Therefore, the capacitance of the edge-reflection type surface acoustic wave resonators 52a and 52b are able to be made smaller than the capacitance of the edge-reflection type surface acoustic wave resonators 53a and 53b defining the parallel arm resonators.

Figure 13:
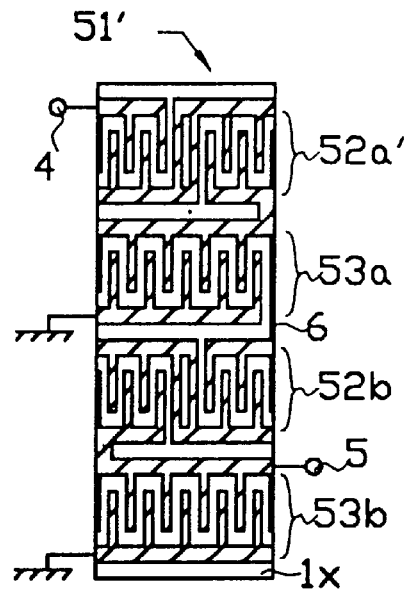
FIG. 13 is a plan view of a surface acoustic wave filter according to a first variation of the sixth preferred embodiment of the present invention.

As shown in FIG. 13, a surface acoustic wave filter 51' includes an edge-reflection type surface acoustic wave resonator 52a' which has a different electrode pattern from that of the edge-reflection type surface acoustic wave resonator 52a. This makes it possible to connect the input/output port 4 at a different position in the edge-reflection type surface acoustic wave resonator 52a'. In this way, by using such a divided construction as shown in FIGS. 12 and 13, the outgoing position of the input/output port 4 is not limited and can be changed easily.

Figure 14:
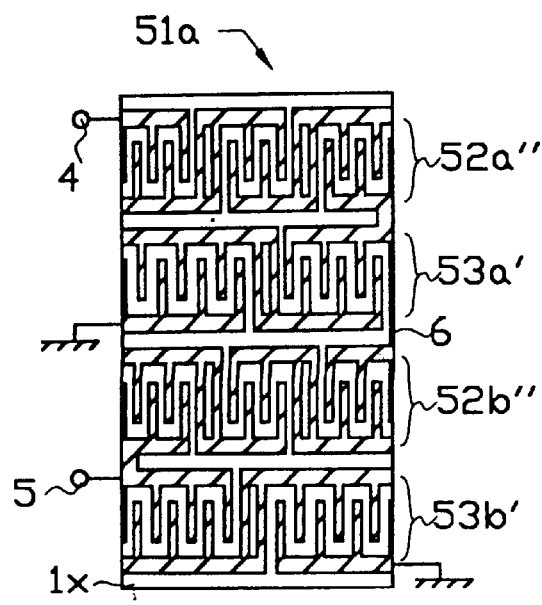
FIG. 14 is a plan view of a surface acoustic wave filter according to a second variation of the sixth preferred embodiment of the present invention.

A surface acoustic wave filter 51a as shown in FIG. 14, is different from the surface acoustic wave filter 51 shown in FIG. 12 in that electrode patterns of the edge-reflection type surface acoustic wave resonators 52a" and 52b" are divided into three and that electrode patterns of the edge-reflection type surface acoustic wave resonators 53a' and 53b' are divided into two. With this construction, even if the number of pairs of electrode fingers of the edge-reflection type surface acoustic wave resonators is increased, the equivalent parallel capacitance is greatly reduced. Further, because the number of divisions of the edge-reflection type surface acoustic wave resonators defining the parallel arm resonators has been made smaller than the number of divisions of the edge-reflection type surface acoustic wave resonators as series arm resonators, the equivalent parallel capacitance of parallel arm resonators is able to be made larger than the equivalent parallel capacitance of series arm resonators. Accordingly, the out-of-band attenuation characteristics of the surface acoustic wave filter is greatly improved.

Figure 15:
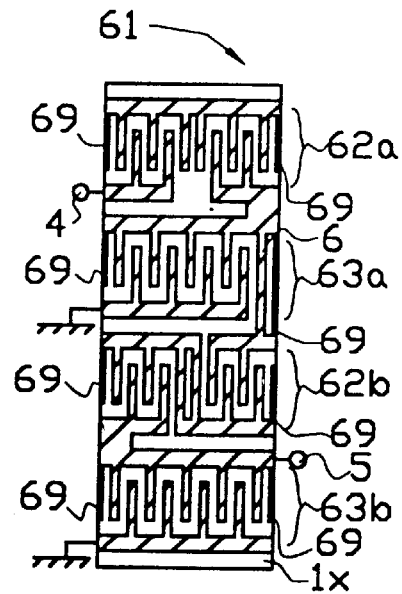
FIG. 15 is a plan view of a surface acoustic wave filter according to a seventh preferred embodiment of the present invention.

Next, a seventh preferred embodiment of the present invention is explained. FIG. 15 is a plan view of a surface acoustic wave filter showing the seventh preferred embodiment of the present invention. Further, the same reference numerals used in FIGS. 1–14 are used in FIG. 15 to indicate like elements, and detailed explanation of like elements is omitted.

A surface acoustic wave filter 61 has substantially the same structure as that of the surface acoustic wave filter 51 shown in FIG. 12 except that the edge-reflection type surface acoustic wave resonators 62a–62b and 63a–63b have dummy electrodes between the outermost electrode fingers of the edge-reflection type surface acoustic wave resonators and the end surfaces of the piezoelectric substrate 1x and between the connecting electrodes 6 and the end surfaces of the piezoelectric substrate 1x.

That is, as shown in FIG. 15, on both sides of the edge-reflection type surface acoustic wave resonators 62a, 62b, 63a and 63b, the dummy electrodes 69 are disposed. Since the connecting electrode 6 is provided on one side of the edge-reflection type surface acoustic wave resonator 63a, the dummy electrode 69 on the side is arranged so as to be adjacent to and substantially parallel to the connecting electrode 6.

According to this structure, the space between the end surface of the piezoelectric substrate 1x and the outermost electrode which is necessarily caused by the difference in the number of pairs of the electrode fingers between the edge-reflection type surface acoustic wave resonator for a series arm resonator and for the edge-reflection type surface acoustic wave resonator for a parallel arm resonator can be adjusted or eliminated by providing the dummy electrode 69.

Further, in the processes of dicing, because dicing takes place in the portion in which dummy electrodes are formed, deterioration of the characteristic due to disconnection, and other problems can be prevented.

Although FIG. 15 shows that one dummy electrode 69 is arranged on each side of the edge-reflection type surface acoustic wave resonators, a plurality of dummy electrodes 69 may be provided. In this case, it is desirable to make the number of dummy electrodes smaller than the number of pairs of edge-reflection type surface acoustic wave resonators so as not to affect the characteristics of the edge-reflection type surface acoustic wave resonators.

Further, it is not necessary to dispose the dummy electrodes 69 on the both sides of all of the edge-reflection type surface acoustic wave resonators, but the dummy electrodes may be disposed only in the portion in which disconnection is likely to occur.

Figure 16:
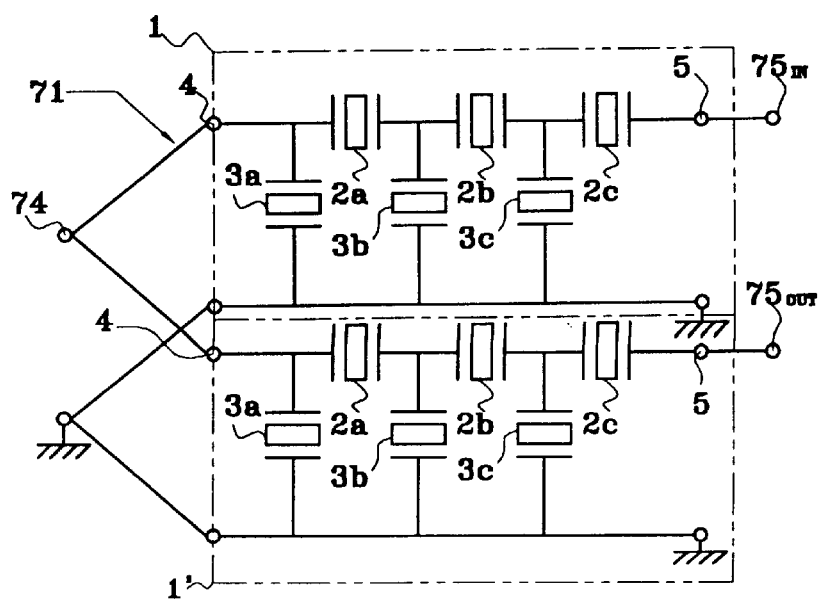
FIG. 16 is an equivalent circuit diagram of a duplexer according to an eighth preferred embodiment of the present invention.

Next, an eighth preferred embodiment of the present invention is explained. FIG. 16 is an equivalent circuit diagram of a duplexer according to the eighth preferred embodiment of the present invention. Further, the same reference numerals used in FIGS. 1–15 are used in FIG. 16 to indicate like elements, and detailed explanation of like elements is omitted.

As shown in FIG. 16, in a duplexer 71, input/output ports 4 of a surface acoustic wave filter 1' for defining a receiver and a surface acoustic wave filter 1 for defining a transmitter are connected to a common terminal 74 to be connected to an antenna (not shown). An input/output port 5 of the surface acoustic wave filter 1' for defining a receiver is connected to an output terminal $75_{OUT}$ to be connected to a receiver circuit (not shown), and an input/output port 5 of the surface acoustic wave filter 1 for defining a transmitter is connected to an input terminal $75_{IN}$ to be connected to a transmitting circuit (not shown).

Figure 17:
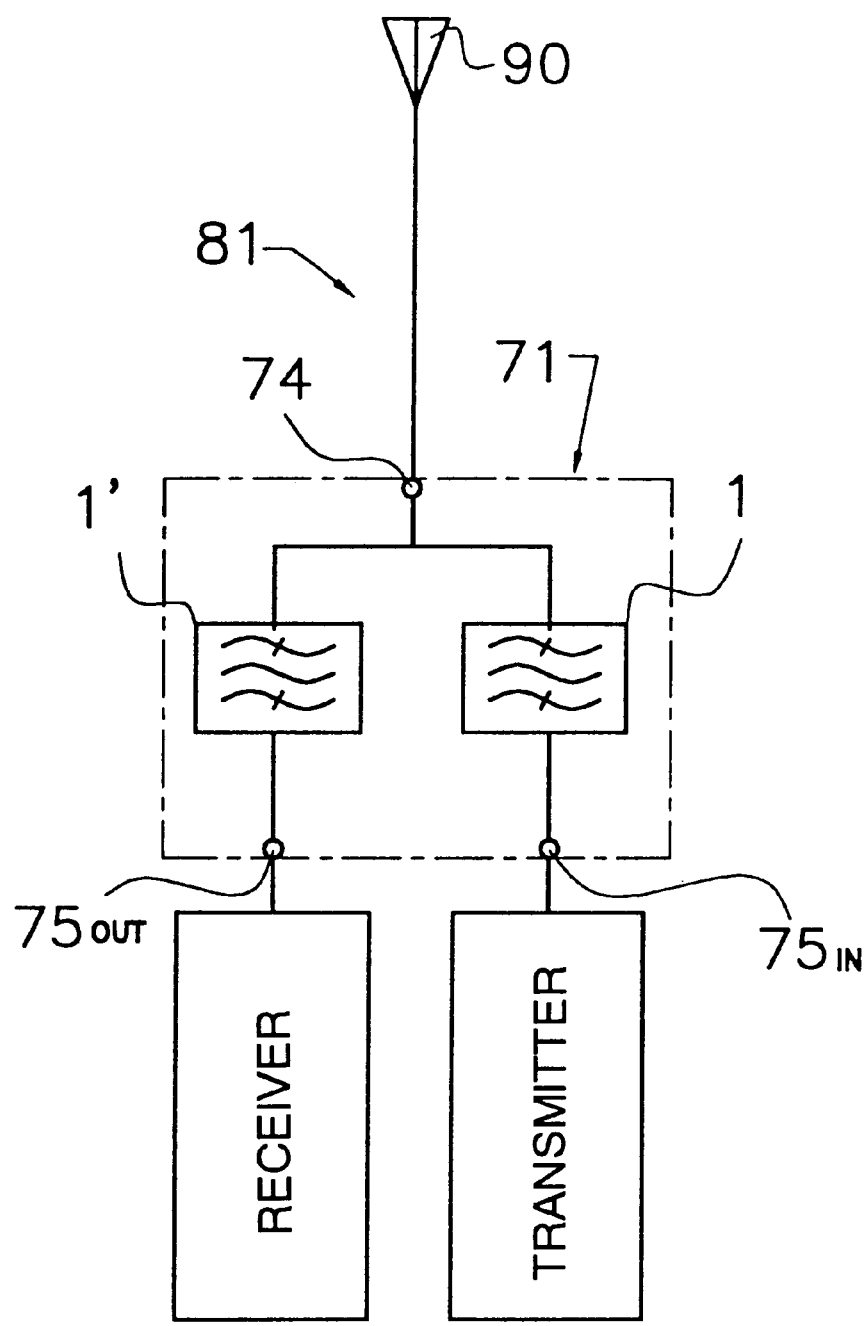
FIG. 17 is a block diagram of a communication apparatus according to a ninth preferred embodiment of the present invention.
Figure 18:
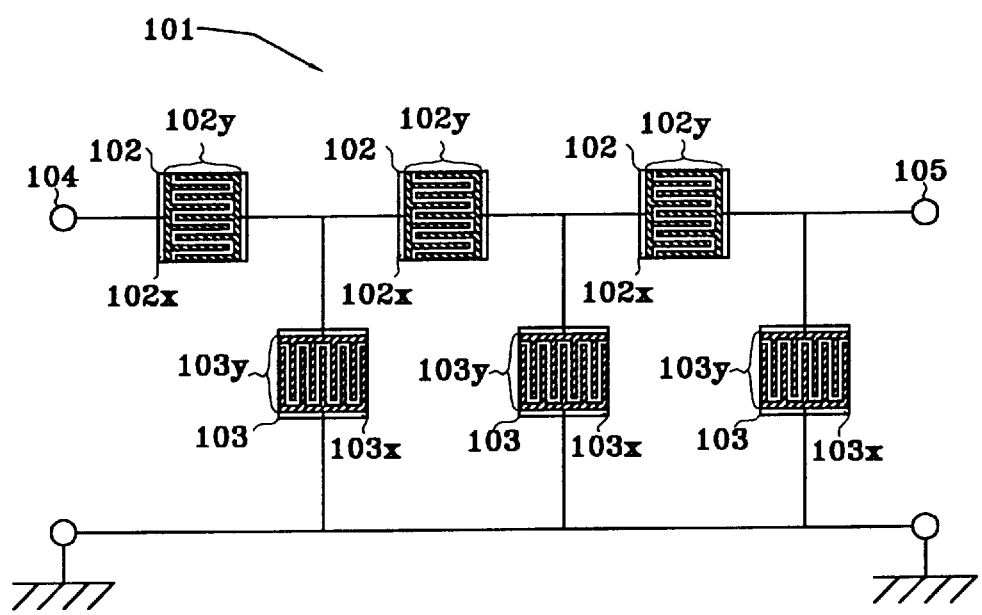
FIG. 18 is a schematic view of a conventional surface acoustic wave filter.

Next, a ninth preferred embodiment of the present invention is explained. FIG. 17 is a block diagram of a communications apparatus showing the ninth preferred embodiment of the present invention, and one example in which the duplexer 71 shown in FIG. 16 is used in the communications apparatus.

As shown in FIG. 17, in a communications apparatus 81, the common terminal 74 of a duplexer 71 having a surface acoustic wave filter 1' defining a receiver and a surface acoustic wave filter 1 defining a transmitter is connected to an antenna 90. An output terminal $75^{OUT}$ is connected to a receiver circuit, and an input terminal $75_{IN}$ is connected to a transmitting circuit.

In the first through ninth preferred embodiments, for the end surface for reflecting surface waves of edge-reflection type surface acoustic wave resonators, a surface which is cut by dicing an original substrate is used, but the present invention is not limited to this. After grooves and holes have been formed by processing such as dicing, etc., each of the piezoelectric substrates may be cut and separated by dicing or other suitable processes While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
    a piezoelectric substrate having a pair of opposed end surfaces; and
    a plurality of edge-reflection type surface acoustic wave resonators arranged to define series and parallel arm resonators and are connected in a ladder configuration; wherein each of the edge-reflection type surface acoustic wave resonators defining the series and parallel arm resonators is disposed on the substrate and arranged along both of the opposed end surfaces of the piezoelectric substrate such that each of the edge-reflection type surface acoustic wave resonators operates using an SH-type surface acoustic wave and uses the opposed end surfaces of the piezoelectric substrate to reflect the SH-type surface acoustic wave to cause resonation.

2. A surface acoustic wave filter according to claim 1, wherein the edge-reflection type surface acoustic wave resonators defining the series arm resonators and the edge-reflection type surface acoustic wave resonators defining the parallel arm resonators are alternately arranged on the substrate.

3. A surface acoustic wave filter according to claim 1, further comprising connecting electrodes disposed on the substrate, wherein the edge-reflection type surface acoustic wave resonators defining the series arm resonators are connected to one another by the connecting electrodes on the substrate, and at least one of the connecting electrodes is separated from an outermost electrode finger of the edge-reflection type surface acoustic wave resonators defining the parallel arm resonators by a distance which is substantially equal to a distance between edges of electrode fingers constituting the edge-reflection type surface acoustic wave resonators defining the parallel arm resonators and the edge of an adjacent one of the electrode fingers.

4. A surface acoustic wave filter according to claim 1, wherein each of the edge-reflection type surface acoustic wave resonators defining the series arm resonators and the edge-reflection type surface acoustic wave resonators defining the parallel arm resonators include split electrodes.

5. A surface acoustic wave filter according to claim 1, further comprising surface acoustic wave resonators which are arranged on the substrate to act as a trap resonator.

6. A surface acoustic wave filter according to claim 1, further comprising reactance elements disposed on the substrate.

7. A surface acoustic wave filter according to claim 1, wherein a width of a transposition section of electrode fingers constituting the edge-reflection type surface acoustic wave resonators defining the parallel arm resonators is larger than a width of a transposition section of electrode fingers constituting the edge-reflection type surface acoustic wave resonators defining the series arm resonators.

8. A surface acoustic wave filter according to claim 1, wherein an electrode pattern of the edge-reflection type surface acoustic wave resonators defining the series resonators and the parallel arm resonators is divided into at least two patterns.

9. A surface acoustic wave filter according to claim 8, wherein the electrode pattern of the edge-reflection type surface acoustic wave resonators defining the parallel arm resonators is divided so as to be smaller than a number of divisions of the electrode pattern of the edge-reflection type surface acoustic wave resonators defining the series arm resonators.

10. A surface acoustic wave filter according to claim 1, further comprising dummy electrodes disposed near end surfaces of the edge-reflection type surface acoustic wave resonators defining the parallel arm resonators or the edge-reflection type surface acoustic wave resonators defining the series arm resonators.

11. A communications apparatus comprising at least one surface acoustic wave filter according to claim 1.

12. A duplexer comprising:
a surface acoustic wave filter including:
    a piezoelectric substrate; and
    a plurality of edge-reflection type surface acoustic wave resonators arranged to define series and parallel arm resonators and are connected in a ladder configuration; wherein
        each of the edge-reflection type surface acoustic wave resonators defining the series and parallel arm resonators is disposed on the substrate and arranged along both of the opposed end surfaces of the piezoelectric substrate such that each of the edge-reflection type surface acoustic wave resonators operates using an SH-type surface acoustic wave and uses the opposed end surfaces of the piezoelectric substrate to reflect the SH-type surface acoustic wave to cause resonation.

13. A duplexer according to claim 12, further comprising connecting electrodes disposed on the substrate, wherein the edge-reflection type surface acoustic wave resonators defining the series arm resonators are connected to one another by the connecting electrodes on the substrate, and at least one of the connecting electrodes is separated from an outermost electrode finger of the edge-reflection type surface acoustic wave resonators by a distance which is substantially equal to a distance between edges of electrode fingers constituting the edge-reflection type surface acoustic wave resonators and the edge of an adjacent one of the electrode fingers.

14. A duplexer according to claim 12, wherein each of the edge-reflection type surface acoustic wave resonators defining the series arm resonators and the edge-reflection type surface acoustic wave resonators defining the parallel arm resonators include split electrodes.

15. A duplexer according to claim 12, further comprising surface acoustic wave resonators which are arranged on the substrate to act as a trap resonator.

16. A duplexer according to claim 12, further comprising reactance elements disposed on the substrate.

17. A duplexer according to claim 12, wherein a width of a transposition section of electrode fingers constituting the edge-reflection type surface acoustic wave resonators defining the parallel arm resonators is larger than a width of a transposition section of electrode fingers constituting the edge-reflection type surface acoustic wave resonators defining the series arm resonators.

18. A duplexer according to claim 12, wherein an electrode pattern of the edge-reflection type surface acoustic wave resonators defining the series resonators and the parallel arm resonators is divided into at least two patterns.

19. A duplexer according to claim 18, wherein the electrode pattern of the edge-reflection type surface acoustic wave resonators defining the parallel arm resonators is divided so as to be smaller than a number of divisions of the electrode pattern of the edge-reflection type surface acoustic wave resonators defining the series arm resonators.

20. A duplexer according to claim 12, further comprising dummy electrodes disposed near end surfaces of the edge-reflection type surface acoustic wave resonators defining the parallel arm resonators or the edge-reflection type surface acoustic wave resonators defining the series arm resonators.

21. A duplexer according to claim 12, wherein the edge-reflection type surface acoustic wave resonators defining the series arm resonators and the edge-reflection type surface acoustic wave resonators defining the parallel arm resonators are alternately arranged on the substrate.

* * * * *